United States Patent [19]

Kuniya et al.

[11] Patent Number: 5,154,796

[45] Date of Patent: Oct. 13, 1992

[54] GIANT GRAINS OR SINGLE CRYSTALS OF CHROMIUM AND PROCESS FOR PRODUCING THE SAME

[75] Inventors: Tsutomu Kuniya; Koichi Hanawa, both of Kanagawa; Hiroshi Tanaka, Tokyo; Shinji Sekine, Kanagawa, all of Japan

[73] Assignee: Tosoh Corporation, Yamaguchi, Japan

[21] Appl. No.: 689,882

[22] PCT Filed: Sep. 28, 1990

[86] PCT No.: PCT/JP90/01260

§ 371 Date: May 24, 1991

§ 102(e) Date: May 24, 1991

[30] Foreign Application Priority Data

Sep. 28, 1989 [JP] Japan .................................. 1-250519
Nov. 15, 1989 [JP] Japan .................................. 1-294803

[51] Int. Cl.$^5$ ............................................. C30B 33/00
[52] U.S. Cl. ........................... 156/603; 148/DIG. 41; 156/605; 156/DIG. 73; 264/2.5; 423/53
[58] Field of Search ............... 148/DIG. 41; 156/603, 156/605, DIG. 73; 423/53; 264/2.5

[56] References Cited

FOREIGN PATENT DOCUMENTS 59-141498 8/1984 Japan .

OTHER PUBLICATIONS

"Growth of Large-Diameter Crystals by HEM for Optical and Laser Application", Khattak et al. (1984) vol. 505, pp. 4–8.

"Thermal Expansion of Chromium Single Crystals At The Neal Temperature"; Masumoto et aL.; J. Phys. Soc. Jap. vol. 27 (3) p. 786.

*Primary Examiner*—Robert Kunemund
*Assistant Examiner*—Felisa Garrett
*Attorney, Agent, or Firm*—Sughrue, Mion, Zinn, Macpeak & Seas

[57] ABSTRACT

The present invention relates to giant grains or single crystals of chromium. Hitherto, since single crystals of chromium were generally obtained by a floating zone method, it was difficult to obtain an optionally shaped chromium single crystal. The present invention has been made in order to overcome these problems and provides a process for producing single crystals of chromium by secondary recrystallization. That is, it has been found that control of the amount of impurities present in a chromium component such as, for example, Co, Ti, Al, Si, and Ca, has a good influence on the formation of single crystals of chromium. For example, if chromium to which the above-described Ti, Al, Si, and Ca have been added in an amount of from 0.0002 wt % to 0.1 wt %, calculated as oxides thereof, or to which from 0.01 to 3 wt % of Co has further been added, is sintered and the resulting chromium molding is heated treated, single crystals of chromium having a complicated shape can be obtained.

14 Claims, No Drawings

GIANT GRAINS OR SINGLE CRYSTALS OF CHROMIUM AND PROCESS FOR PRODUCING THE SAME

TECHNICAL FIELD

The present invention relates to giant grains or single crystals of chromium and a process for producing the same.

BACKGROUND TECHNIQUE

Chromium, though excellent in corrosion resistance and heat resistance, is limited in its application to use chiefly as an additive to alloys, and use of chromium as a single substance has not been put into practical use except as a target material for sputtering.

The main reason for this resides in chromium's brittleness which itself is attributed to brittleness of grain boundaries, and plastic processing of chromium is therefore very difficult.

Hence, production of practical chromium moldings cannot but rely on processes having poor yields, such as discharge processing and wire cutting, and it has been virtually impossible to obtain, chromium moldings of complicated shape.

Problems due to the brittleness of grain boundaries of metals such as chromium can be fundamentally solved by obtaining single crystals having no boundaries.

As a method for forming single crystals of metals, for example, molybdenum, there is proposed a recrystallization method as described in JP-A-59-141498. This method is concerned with a method of addition of an additive called a pinning element to a single crystal component as an essential condition for the single crystal formation, and strict quantitative control of the addition (CaO, MgO) is required.

A currently widespread method for obtaining chromium single crystals is a floating zone method. This method, however, involves problems such as limited productivity per unit time, limitation of the products in shape to a bar of relatively small diameter, and need of a very complicated apparatus. It has thus been extremely difficult to obtain a chromium single crystal having a large size or a complicated shape.

If a large-sized, optionally shaped chromium single crystal can be obtained easily, the problem of poor yields in working by the conventional processing techniques would be eliminated, and application to electronic parts in which moldings having a relatively complicated shape are required could be expected, thus greatly broadening the application of chromium.

DISCLOSURE OF THE INVENTION

The present inventors have conducted extensive studies on preparation of chromium single crystals, paying attention to the behavior of impurities present in a chromium component, e.g., Ti, Al, Si, and Ca, in single crystal formation of chromium by secondary recrystallization. As a result, they have noted that these impurities exert a favorable influence on single crystal formation of chromium and found that it is possible to achieve single crystal formation of chromium by first sintering chromium containing at least one of these impurities as an unavoidable component, chromium to which at least one element selected from Ti, Al, Ca, and Si has been added in an amount of a certain range, or chromium to which these have been added and which further contains Co, and then subjecting the sintered material to heat treatment under a relatively mild condition, i.e., secondary recrystallization, leading to accomplishment of the present invention.

That is, the present invention relates to a process for producing giant grains or single crystals of chromium, which comprises heat treating a chromium molding to which at least one element selected from the group consisting of Ti, Al, Ca, and Si has been added, or a chromium molding which contains Co and to which at least one element selected from the group consisting of Ti, Al, Ca, and Si has been added, or a chromium molding which contains at least one of these elements, each chromium molding having a strain imparted thereto by sintering; and giant grains or single crystals of chromium to which at least one element selected from the group consisting of Ti, Al, Ca, and Si has been added in an amount of from 0.0002 wt % as a lower limit to 0.1 wt % as an upper limit calculated as an oxide thereof, or of chromium which contains from 0.01 to 3 wt % of Co and to which at least one element selected from the group consisting of Ti, Al, Ca, and Si has been added in an amount of from 0.0002 wt % as a lower limit to 0.1 wt % as an upper limit calculated as an oxide thereof.

The present inventors have further conducted extensive studies. As a result, it has been found that if a molding obtained by sintering the above-described chromium and subjecting the sintered material to plastic processing is used, the subsequent heat treatment can be carried out under a milder condition. The giant grain as referred to in the present invention is substantially the same as an aggregate of relatively large single crystals.

Refining of metallic chromium is performed by processes such as reducing smelting and electrolytic refining. Chromium ores which are used as raw materials in these processes contain components such as Fe, Al, Si, Ni, and Cu in addition to chromium. Chromium obtained by the electrolytic refining process, which is considered to give the industrially highest purity, still contains impurities as it is in the obtained state, such as 20 to 1,000 ppm of Fe, 1 to 20 ppm of Al, 30 to 600 ppm of Si, 1 to 20 ppm of Ti, and 1 to 100 ppm of Ca. In the present invention, though it is preferred to use chromium obtained by the electrolytic refining process from the standpoint of the purity of the obtained product, it is also suitable to use chromium obtained by the usual reducing smelting process in which chromium and other components are mixed in predetermined amounts in the oxide state and then metallized.

In the present invention, as a method for adding necessary amounts of the additives to the chromium component, there is a method in which the additives are previously added to the chromium component for obtaining chromium, such as chromium oxide.

This method is preferred in the present invention. However, the addition may be effected by any method as long as incorporation of other impurities may be prevented and a uniform composition may be obtained. An amount of the additives to the chromium component is from 0.0002 wt % as oxides of the additives (this amount showing an amount of the additives to be added) as a lower limit to 0.1 wt % as oxides in chromium as an upper limit. Amounts less than 0.0002 wt % produce no significant effect of addition of the additives, and amounts exceeding 0.1 wt % cause excessive pinning effects of chromium boundaries, making it difficult to produce a single crystal.

Since the above-described additives, even added within the range of from 0.0002 wt % to 0.1 wt % (as oxides in any case), may sometimes be locally precipitated in chromium, amounts not exceeding 0.03 wt % are preferred.

There is no particular restriction concerning the method of incorporating the Co component into the chromium component. Co may be added to chromium directly or at any stage of the metallization of chromium so long as the chromium contains a predetermined amount of Co at the sintering of chromium.

The content of Co is from 0.01 to 3 wt %. Amounts of Co less than 0.01 wt % produce no significant effect of addition, and amounts exceeding 3 wt % adversely affect single crystal formation of chromium. Further, the amounts of other components to be used in combination with Co are the same as described above.

In the present invention, the presence of Co makes the subsequent heat treatment condition milder. This is believed ascribable to the catalytic effect of Co in recrystallization of chromium.

Chromium which is used as a raw material in the process of the present invention is the chromium as described above and is formed into a usual powdered state and sintered. Sintering is conducted according to any of commonly employed techniques, such as burning and hot isostatic pressing (HIP), so that the sintered material may undergo thermal strain. The sintering temperature is usually 1,200° C. or higher but not higher than the melting point of chromium, the sintering time, though not particularly limited, is ten or more minutes, and the sintering pressure is preferably 1,000 atms. or more. The shape of the sintered material can be controlled by properly selecting the mold container to be used for sintering. Further it is possible to produce a sintered material (molding) having a relatively complicated shape through pre-molding prior to the heat treatment.

In the process of the present invention, the molding thus obtained by sintering can be subjected to plastic processing thereby making the subsequent heat treatment condition milder. In this case, the plastic processing is not particularly restricted and includes generally employed methods, for example, rolling, forging, and extrusion working. For example, rolling is carried out at about 700° C. or lower at a rolling rate of from 30 to 90%.

The thus obtained chromium molding is then subjected to heat treatment (secondary recrystallization). This heat treatment is carried out at a temperature of 1,300° C. or higher but lower than the melting point of chromium (1,860° C.), preferably for 30 minutes or more in a reducing atmosphere such as a hydrogen atmosphere, though these conditions vary depending on whether the sintered chromium has been subjected to plastic processing or the kind of additives to be added to the chromium In cases of using chromium containing Co as described above, the heat treatment can be effected at relatively low temperatures (1,300° C.). If the heat treatment temperature is lower than 1,300° C., the single crystal formation of chromium is insufficient.

The chromium obtained by the above-described heat treatment is a single crystal which can be confirmed by the X-ray back reflection Laue method.

BEST MODES IN PRACTICING THE INVENTION

Now, the present invention is described with reference to the following examples, but they should not be construed to be limiting the scope of the invention.

EXAMPLE 1

Chromium oxide to which an oxide(s) to be added, had been added in an amount of up to 0.2 wt % as shown in Table 1 by a wet method was reduced in hydrogen at 1,550° C. for 10 hours to obtain metallic chromium which was thereafter sintered by a hot isostatic pressing method to obtain ingots. The sintering conditions were from 1,200° to 1,300° C. for the temperature, from 1,200 to 2,000 atms. for the pressure and one hour for the time, respectively. Each of the sintered materials was hot rolled at 500° C. at from 30 to 90%, and the obtained rolled material was cut into a size of 200 mm×50 mm×10 mm and subjected to heat treatment in a hydrogen atmosphere at 1,500° C. for 3 hours to obtain a single crystal of chromium. This was confirmed to be a single crystal by the X-ray back reflection Laue method. The crystal state of chromium is shown along with the content of additives in chromium (Table 1), the temperature and pressure at sintering (Table 2), and the rolling rate of sintered material (Table 3). For comparison, though chromium sintered at 1,000° C. was heat treated as it was, the crystal state was a fine grain. The same procedures were followed to obtain rolled materials of chromium to which oxides had been added. Each of the rolled materials was cut into a size of 200 mm×50 mm×10 mm and subjected to heat treatment in a hydrogen atmosphere at from 1,200° to 1,600° C. for 3 hours. The relation between the heat treatment temperature and the crystal grain growth is shown in Table 4.

TABLE 1

| Amount of Addition (ppm) | | | | |
|---|---|---|---|---|
| Ti | Al | Ca | Si | Crystal State |
| 0 | 0 | 0 | 0 | Fine grains |
| 10 | 0 | 0 | 0 | Partly giant grains |
| 0 | 20 | 0 | 0 | Partly giant grains |
| 0 | 50 | 0 | 0 | Giant grains |
| 0 | 0 | 30 | 0 | Partly giant grains |
| 0 | 0 | 0 | 10 | Partly giant grains |
| 0 | 0 | 20 | 30 | Single crystal |
| 10 | 0 | 0 | 30 | Single crystal |
| 0 | 10 | 0 | 30 | Single crystal |
| 10 | 0 | 30 | 0 | Single crystal |
| 10 | 0 | 10 | 20 | Single crystal |
| 10 | 10 | 30 | 150 | Single crystal |
| 10 | 10 | 10 | 10 | Giant grains |
| 100 | 100 | 100 | 100 | Giant grains |
| 50 | 50 | 300 | 500 | Partly giant grains |
| 0 | 0 | 400 | 800 | Fine grains |
| 300 | 300 | 300 | 300 | Fine grains |

TABLE 2

| Temperature | Pressure | Crystal State |
|---|---|---|
| 1,000° C. | 1,800 atms. | Fine grains |
| 1,200° C. | 1,800 atms. | Giant grains |
| 1,300° C. | 1,800 atms. | Single crystal |
| 1,300° C. | 1,200 atms. | Partly giant grains |
| 1,300° C. | 1,600 atms. | Single crystal |
| 1,300° C. | 2,000 atms. | Single crystal |

Composition of additives: Ti:Al:Ca:Si = 10:10:30:150 (ppm)

TABLE 3

| Rolling Rate | Crystal State |
| --- | --- |
| 30% | Giant grains |
| 50% | Single crystal |
| 60% | Single crystal |
| 70% | Single crystal |
| 90% | Giant grains |

Composition of additives: Ti:Al:Ca:Si = 10:10:30:150 (ppm)

TABLE 4

| Heat Treatment Temperature | Crystal State |
| --- | --- |
| 1,200° C. | Fine grains |
| 1,300° C. | Fine grains |
| 1,400° C. | Partly giant grains |
| 1,500° C. | Single crystal |
| 1,600° C. | Single crystal |

Composition of additives: Ti:Al:Ca:Si = 10:10:30:150 (ppm)

EXAMPLE 2

Chromium oxide to which the respective oxides had been added by a wet method so as to be Ti:Al:Ca:Si = 10:10:30:150 and from 0.1 wt % to 5.0 wt % of cobalt oxide had been further added similarly was reduced in hydrogen at 1,550° C. for 10 hours to obtain metallic chromium which was thereafter sintered by a hot isostatic pressing method to obtain ingots. The sintering conditions are from 1,200° to 1,300° C. for the temperature, from 1,200 to 2,000 atms. for the pressure and one hour for the time, respectively. The ingot was cut into a size of 200 mm × 50 mm × 50 mm and subjected to heat treatment in a hydrogen atmosphere at 1,500° C. for 3 hours to obtain a single crystal of chromium. This was confirmed to be a single crystal by the X-ray back reflection Laue method. The crystal state of chromium is shown along with the Co content in chromium (Table 5) and the temperature and pressure at sintering (Table 6).

EXAMPLE 3

Sintered materials obtained by the same procedures as in Example 2 were each cut into a size of 200 mm x 50 mm x 50 mm and subjected to heat treatment in a hydrogen atmosphere at from 1,200° to 1,600° C. for 3 hours. The relation between the heat treatment temperature and the crystal grain growth is shown in Table 7.

TABLE 5

| Co Content | Crystal State |
| --- | --- |
| 0.001 wt % | Single crystal |
| 0.01 wt % | Single crystal |
| 0.1 wt % | Single crystal |
| 1 wt % | Single crystal |
| 3 wt % | Partly giant grains |
| 5 wt % | Fine grains |

TABLE 6

| Temperature | Pressure | Crystal State |
| --- | --- | --- |
| 1,000° C. | 1,800 atms. | Fine grains |
| 1,200° C. | 1,800 atms. | Giant grains |
| 1,300° C. | 1,800 atms. | Single crystal |
| 1,300° C. | 1,200 atms. | Partly giant grains |
| 1,300° C. | 1,600 atms. | Single crystal |
| 1,300° C. | 2,000 atms. | Single crystal |

TABLE 7

| Heat Treatment Temperature | Crystal State |
| --- | --- |
| 1,200° C. | Fine grains |
| 1,300° C. | Partly giant grains |
| 1,400° C. | Giant grains |
| 1,500° C. | Single crystal |
| 1,600° C. | Single crystal |

EXAMPLE 4

Ingots obtained in the same manner as in Example 1 (sintering temperature: from 1,100° to 1,300° C.) were each cut into a size of 200 mm × 50 mm × 50 mm and subjected to heat treatment in a hydrogen atmosphere at 1,600° C. for 3 hours to obtain a single crystal of chromium. This was confirmed to be a single crystal by the X-ray back reflection Laue method. The crystal state of chromium is shown along with the content of additives in chromium (Table 8) and the temperature and pressure at sintering (Table 9).

TABLE 8

| Amount of Addition (ppm) | | | | Crystal State |
| --- | --- | --- | --- | --- |
| Ti | Al | Ca | Si | |
| 0 | 0 | 0 | 0 | Fine grains |
| 10 | 0 | 0 | 0 | Partly giant grains |
| 0 | 20 | 0 | 0 | Partly giant grains |
| 0 | 50 | 0 | 0 | Fine grains |
| 0 | 0 | 30 | 0 | Partly giant grains |
| 0 | 0 | 0 | 10 | Partly giant grains |
| 0 | 0 | 20 | 30 | Single crystal |
| 10 | 0 | 0 | 30 | Single crystal |
| 0 | 10 | 0 | 30 | Single crystal |
| 10 | 0 | 30 | 0 | Single crystal |
| 10 | 0 | 10 | 20 | Single crystal |
| 10 | 10 | 30 | 150 | Single crystal |
| 10 | 10 | 10 | 10 | Giant grains |
| 100 | 100 | 100 | 100 | Giant grains |
| 50 | 50 | 300 | 500 | Partly giant grains |
| 0 | 0 | 400 | 800 | Fine grains |
| 300 | 300 | 300 | 300 | Fine grains |

EXAMPLE 5

Sintered materials obtained by the same procedure as in Example 4 were each cut into a size of 200 mm × 50 mm × 50 mm and subjected to heat treatment in a hydrogen atmosphere at from 1,200° to 1,600° C. for 3 hours. The relation between the heat treatment temperature and the crystal gain growth is shown in Table 10.

TABLE 9

| Temperature | Pressure | Crystal State |
| --- | --- | --- |
| 1,100° C. | 1,800 atms. | Giant grains |
| 1,200° C. | 1,800 atms. | Giant grains |
| 1,300° C. | 1,800 atms. | Single crystal |
| 1,300° C. | 1,200 atms. | Partly giant grains |
| 1,300° C. | 1,600 atms. | Single crystal |
| 1,300° C. | 2,000 atms. | Single crystal |

TABLE 10

| Heat Treatment Temperature | Crystal State |
| --- | --- |
| 1,200° C. | Fine grains |
| 1,300° C. | Fine grains |
| 1,400° C. | Fine grains |
| 1,500° C. | Partly giant grains |
| 1,600° C. | Single crystal |

EXAMPLE 6

Ingots obtained in the same manner as in Example 5 were each rolled at 500° C. at a rolling rate of from 30 to 90%, cut into a size of 200 mm × 50 mm × 50 mm, and the subjected to heat treatment in a hydrogen atmosphere at 1,500° C. for 3 hours to obtain a single crystal of chromium. This was confirmed to be a single crystal by the X-ray back reflection Laue method. The crystal state of chromium is shown along with the Co content in chromium (Table 11), the content of additives in chromium (Table 12), the temperature and pressure at sintering (Table 13), and the rolling rate (Table 14).

EXAMPLE 7

Rolled materials obtained by the same procedures as in Example 6 were each cut into a size of 200 mm × 50 mm × 10 mm and subjected to heat treatment in a hydrogen atmosphere at from 1,200° to 1,600° C. for 3 hours. The relation between the heat treatment temperature and the crystal grain growth is shown in Table 15.

TABLE 11

| Co Content | Crystal State |
| --- | --- |
| 0.001 wt % | Single crystal |
| 0.01 wt % | Partly giant grains |
| 0.1 wt % | Single crystal |
| 1 wt % | Single crystal |
| 3 wt % | Partly giant grains |
| 5 wt % | Fine grains |

(Composition of additives: Ti:Al:Ca:Si = 10:10:30:150 (ppm), Sintering temperature: 1,250° C., Sintering pressure: 1,500 atms.)

TABLE 12

| Amount of Addition (ppm) | | | | |
| --- | --- | --- | --- | --- |
| Ti | Al | Ca | Si | Crystal State |
| 0 | 0 | 0 | 0 | Fine grains |
| 10 | 0 | 0 | 0 | Partly giant grains |
| 0 | 20 | 0 | 0 | Partly giant grains |
| 0 | 50 | 0 | 0 | Giant grains |
| 0 | 0 | 30 | 0 | Giant grains |
| 0 | 0 | 0 | 10 | Partly giant grains |
| 0 | 0 | 20 | 30 | Single crystal |
| 10 | 0 | 0 | 30 | Single crystal |
| 0 | 10 | 0 | 30 | Single crystal |
| 10 | 0 | 30 | 0 | Single crystal |
| 10 | 0 | 10 | 20 | Single crystal |
| 10 | 10 | 30 | 150 | Single crystal |
| 10 | 10 | 10 | 10 | Giant grains |
| 100 | 100 | 100 | 100 | Giant grains |
| 50 | 50 | 300 | 500 | Giant grains |
| 0 | 0 | 400 | 800 | Fine grains |
| 300 | 300 | 300 | 300 | Fine grains |

(Co content: 0.1 wt %, Sintering temperature: 1,250° C., Sintering pressure: 1,500 atms.)

TABLE 13

| Temperature | Pressure | Crystal State |
| --- | --- | --- |
| 1,100° C. | 1,800 atms. | Fine grains |
| 1,200° C. | 1,800 atms. | Giant grains |
| 1,300° C. | 1,800 atms. | Single crystal |
| 1,300° C. | 1,200 atms. | Partly giant grains |
| 1,300° C. | 1,600 atms. | Single crystal |
| 1,300° C. | 2,000 atms. | Single crystal |

(Composition of additives: Ti:Al:Ca:Si = 10:10:30:150 (ppm), Co content: 0.1 wt %)

TABLE 14

| Rolling Rate | Crystal State |
| --- | --- |
| 0% | Fine grains |
| 10% | Fine grains |
| 30% | Single crystal |
| 50% | Single crystal |
| 60% | Single crystal |
| 70% | Giant grains |
| 80% | Giant grains |
| 90% | Partly giant grains |

(Composition of additives: Ti:Al:Ca:Si = 10:10:30:150 (ppm), Co content: 0.1 wt %, Sintering temperature: 1,250° C., Sintering pressure: 1,500 atms.)

TABLE 15

| Heat Treatment Temperature | Crystal State |
| --- | --- |
| 1,200° C. | Fine grains |
| 1,300° C. | Partly giant grains |
| 1,400° C. | Giant grains |
| 1,500° C. | Single crystal |
| 1,600° C. | Single crystal |

EXAMPLE 8

Chromium oxide to which $TiO_2$ had been added in an amount of up to 0.2 wt % as shown in Table 16 by a wet method was reduced in hydrogen at 1,550° C. for 10 hours to obtain metallic chromium which was thereafter sintered by a hot isostatic pressing method to obtain ingots. The sintering conditions are from 1,200° to 1,300° C. for the temperature, from 1,200 to 2,000 atms. for the pressure and one hour for the time, respectively. Each of the sintered materials was hot rolled at 500° C. at from 30 to 90%, and the obtained rolled material was cut into a size of 200 mm × 50 mm × 10 mm and subjected to heat treatment in a hydrogen atmosphere at 1,500° C. for 3 hours to obtain a single crystal of chromium. This was confirmed to be a single crystal by the X-ray back reflection Laue method. The crystal state of chromium is shown along with the $TiO_2$ content in chromium (Table 16), the temperature and pressure at sintering (Table 17), and the rolling rate of sintered material (Table 18). For comparison, through chromium sintered at 1,000° C. was heat treated as it was, the crystal state was a fine grain. The same procedures were followed to obtain rolled materials of chromium to which $TiO_2$ had been added. Each of the rolled materials was cut into a size of 200 mm × 50 mm × 10 mm and subjected to heat treatment in a hydrogen atmosphere at from 1,200° to 1,600° C. for 3 hours. The relation between the heat treatment temperature and the crystal grain growth is shown in Table 19.

TABLE 16

| Amount of Addition | Crystal State |
| --- | --- |
| 0 ppm | Fine grains |
| 2 ppm | Giant grains |
| 10 ppm | Single crystal |
| 50 ppm | Single crystal |
| 100 ppm | Partly giant grains |
| 1,000 ppm | Partly giant grains |
| 2,000 ppm | Fine grains |

TABLE 17

| Temperature | Pressure | Crystal State |
| --- | --- | --- |
| 1,000° C. | 1,800 atms. | Fine grains |
| 1,200° C. | 1,800 atms. | Giant grains |
| 1,300° C. | 1,800 atms. | Single grains |
| 1,300° C. | 1,200 atms. | Partly giant grains |
| 1,300° C. | 1,600 atms. | Single crystal |

TABLE 17-continued

| Temperature | Pressure | Crystal State |
|---|---|---|
| 1,300° C. | 2,000 atms. | Single crystal |

TABLE 18

| Rolling Rate | Crystal State |
|---|---|
| 30% | Giant grains |
| 50% | Single crystal |
| 60% | Single crystal |
| 70% | Single crystal |
| 90% | Giant grains |

TABLE 19

| Heat Treatment Temperature | Crystal State |
|---|---|
| 1,200° C. | Fine grains |
| 1,300° C. | Fine grains |
| 1,400° C. | Partly giant grains |
| 1,500° C. | Single crystal |
| 1,600° C. | Single crystal |

EXAMPLE 9

Chromium oxide to which $TiO_w$ had been added by a wet method so as to have a $TiO_2$ content of 10 ppm in a reduced material after reduction of chromium oxide and to which from 0.1 wt % to 5.0 wt % of cobalt oxide had been further added similarly was reduced in hydrogen at 1,550° C. for 10 hours to obtain metallic chromium which was thereafter sintered by a hot isostatic pressing method to obtain ingots. The sintering conditions are from 1,200° to 1,300° C. for the temperature, from 1,200 to 2,000 atms. for the pressure and one hour for the time, respectively. The ingot was cut into a size of 200 mm × 50 mm × 50 mm and subjected to heat treatment in a hydrogen atmosphere at 1,500° C. for 3 hours to obtain a single crystal of chromium. This was confirmed to be a single crystal by the X-ray back reflection Laue method. The crystal state of chromium is shown along with the Co content in chromium (Table 20), $TiO_2$ content (Table 21), and the temperature and pressure at sintering (Table 22).

EXAMPLE 10

Sintered materials obtained by the same procedure as in Example 9 were each cut into a size of 200 mm × 50 mm × 50 mm and subjected to heat treatment in a hydrogen atmosphere at from 1,200° to 1,600° C. for 3 hours. The relation between the heat treatment temperature and the crystal grain growth is shown in Table 23.

TABLE 20

| Co Content | Crystal State |
|---|---|
| 0.001 wt % | Single crystal |
| 0.01 wt % | Single crystal |
| 0.1 wt % | Single crystal |
| 1.0 wt % | Single crystal |
| 3.0 wt % | Partly giant grains |
| 5.0 wt % | Fine grains |

TABLE 21

| Amount of Addition | Crystal State |
|---|---|
| 0 ppm | Fine grains |
| 2 ppm | Giant grains |
| 10 ppm | Single crystal |
| 50 ppm | Single crystal |
| 100 ppm | Partly giant grains |
| 1,000 ppm | Partly giant grains |
| 2,000 ppm | Fine grains |

TABLE 22

| Temperature | Pressure | Crystal State |
|---|---|---|
| 1,000° C. | 1,800 atms. | Fine grains |
| 1,200° C. | 1,800 atms. | Giant grains |
| 1,300° C. | 1,800 atms. | Single crystal |
| 1,300° C. | 1,200 atms. | Partly giant grains |
| 1,300° C. | 1,600 atms. | Single crystal |
| 1,300° C. | 2,000 atms. | Single crystal |

TABLE 23

| Heat Treatment Temperature | Crystal State |
|---|---|
| 1,200° C. | Fine grains |
| 1,300° C. | Partly giant grains |
| 1,400° C. | Giant grains |
| 1,500° C. | Single crystal |
| 1,600° C. | Single crystal |

EXAMPLE 11

Ingots obtained in the same manner as in Example 8 (sintering temperature: from 1,100° to 1,300° C.) were each cut into a size of 200 mm × 50 mm × 50 mm and subjected to heat treatment in a hydrogen atmosphere at 1,600° C. for 3 hours to obtain a single crystal of chromium. This was confirmed to be a single crystal by the X-ray back reflection Laue method. The crystal state of chromium is shown along with the $TiO_2$ content in chromium (Table 24) and the temperature and pressure at sintering (Table 25).

EXAMPLE 12

Sintered materials obtained by the same procedure as in Example 11 were each cut into a size of 200 mm × 50 mm × 50 mm and subjected to heat treatment in a hydrogen atmosphere at from 1,200° to 1,600° C. for 3 hours. The relation between the heat treatment temperature and the crystal grain growth is shown in Table 26.

TABLE 24

| Amount of Addition | Crystal State |
|---|---|
| 0 ppm | Fine grains |
| 2 ppm | Giant grains |
| 10 ppm | Single crystal |
| 50 ppm | Single crystal |
| 100 ppm | Partly giant grains |
| 1,000 ppm | Partly giant grains |
| 2,000 ppm | Fine grains |

TABLE 25

| Temperature | Pressure | Crystal State |
|---|---|---|
| 1,000° C. | 1,800 atms. | Giant grains |
| 1,200° C. | 1,800 atms. | Giant grains |
| 1,300° C. | 1,800 atms. | Single crystal |
| 1,300° C. | 1,200 atms. | Partly giant grains |
| 1,300° C. | 1,600 atms. | Single crystal |
| 1,300° C. | 2,000 atms. | Single crystal |

TABLE 26

| Heat Treatment Temperature | Crystal State |
| --- | --- |
| 1,200° C. | Fine grains |
| 1,300° C. | Fine grains |
| 1,400° C. | Fine grains |
| 1,500° C. | Partly giant grains |
| 1,600° C. | Single crystal |

EXAMPLE 13

Ingots obtained in the same manner as in Example 12 were each rolled at 500° C. at a rolling rate of from 30 to 90%, cut into a size of 200 mm×50 mm×50 mm, and then subjected to heat treatment in a hydrogen atmosphere at 1,500° C. for 3 hours to obtain a single crystal of chromium. This was confirmed to be a single crystal by the X-ray back reflection Laue method. The crystal state of chromium is shown along with the Co content in chromium (Table 27), the $TiO_2$ content (Table 28), the temperature and pressure at sintering (Table 29), and the rolling rate (Table 30).

EXAMPLE 14

Rolled materials obtained by the same procedures as in Example 13 were each cut into a size of 200 mm×50 mm×10 mm and subjected to heat treatment in a hydrogen atmosphere at from 1,200° to 1,600° C. for 3 hours. The relation between the heat treatment temperature and the crystal grain growth is shown in Table 31.

TABLE 27

| Co Content | Crystal State |
| --- | --- |
| 0.001 wt % | Single crystal |
| 0.01 wt % | Partly giant grains |
| 0.1 wt % | Single crystal |
| 1.0 wt % | Single crystal |
| 3.0 wt % | Partly giant grains |
| 5.0 wt % | Fine grains |

($TiO_2$ content: 10 ppm, Sintering temperature: 1,250° C., Sintering pressure: 1,500 atms.)

TABLE 28

| Amount of Addition | Crystal State |
| --- | --- |
| 0 ppm | Fine grains |
| 2 ppm | Giant grains |
| 10 ppm | Single crystal |
| 50 ppm | Single crystal |
| 100 ppm | Partly giant grains |
| 1,000 ppm | Partly giant grains |
| 2,000 ppm | Fine grains |

(Co content: 0.1 wt %, Sintering temperature: 1,250° C., Sintering pressure: 1,500 atms.)

TABLE 29

| Temperature | Pressure | Crystal State |
| --- | --- | --- |
| 1,000° C. | 1,800 atms. | Fine grains |
| 1,200° C. | 1,800 atms. | Giant grains |
| 1,300° C. | 1,800 atms. | Single crystal |
| 1,300° C. | 1,200 atms. | Partly giant grains |
| 1,300° C. | 1,600 atms. | Single crystal |
| 1,300° C. | 2,000 atms. | Single crystal |

(Si content: 80 ppm, Co content: 0.1 wt %)

TABLE 30

| Rolling Rate | Crystal State |
| --- | --- |
| 0% | Fine grains |
| 10% | Fine grains |

TABLE 30-continued

| Rolling Rate | Crystal State |
| --- | --- |
| 30% | Single crystal |
| 50% | Single crystal |
| 60% | Single crystal |
| 70% | Giant grains |
| 80% | Giant grains |
| 90% | Partly giant grains |

(Ti content: 10 ppm, Co content: 0.1 wt %, Sintering temperature: 1,250° C., Sintering pressure: 1,500 atms.)

TABLE 31

| Heat Treatment Temperature | Crystal State |
| --- | --- |
| 1,200° C. | Fine grains |
| 1,300° C. | Partly giant grains |
| 1,400° C. | Giant grains |
| 1,500° C. | Single crystal |
| 1,600° C. | Single crystal |

EXAMPLE 15

High-purity chromium obtained by the electrolytic refining process was sintered by a hot isostatic pressing method. Chemical analysis of the chromium as used herein reveals as follows.

Cr: 99.98 wt %, Si: 80 ppm, Ti: 10 ppm, Al: 10 ppm, Ca: 20 ppm

The sintering conditions are from 1,200° to 1,300° C. for the temperature, one hour for the time and from 1,200 to 2,000 atms. for the pressure, respectively. Each of the sintered materials was cut into a size of 200 mm×50 mm×50 mm and subjected to heat treatment in a hydrogen atmosphere at 1,600° C. for 3 hours to obtain a single crystal of chromium. This was confirmed to be a single crystal by the X-ray back reflection Laue method. The influences of the temperature and pressure at sintering against the growth of crystal grains are shown in Table 32. For comparison, the crystal state of one sintered at 1,000° C. is also given in the same table.

EXAMPLE 16

Sintered materials obtained in the same procedures as in Example 15 were each cut into the same size and subjected to heat treatment in a hydrogen atmosphere at from 1,200° to 1,600° C. for 3 hours. The relation between the heat treatment temperature and the crystal grain growth is shown in Table 33.

TABLE 32

| Temperature | Pressure | Crystal State |
| --- | --- | --- |
| 1,000° C. | 1,800 atms. | Fine grains |
| 1,200° C. | 1,800 atms. | Giant grains |
| 1,300° C. | 1,800 atms. | Single crystal |
| 1,300° C. | 1,200 atms. | Partly giant grains |
| 1,300° C. | 1,600 atms. | Single crystal |
| 1,300° C. | 2,000 atms. | Single crystal |

TABLE 33

| Heat Treatment Temperature | Crystal State |
| --- | --- |
| 1,200° C. | Fine grains |
| 1,300° C. | Fine grains |
| 1,400° C. | Fine grains |
| 1,500° C. | Partly giant grains |
| 1,600° C. | Single crystal |

EXAMPLE 17

Sintered materials obtained in the same manner as in Example 15 were each hot rolled at 500° C. at 60%, cut into a size of 200 mm×50 mm×50 mm, and then subjected to heat treatment in a hydrogen atmosphere at 1,600° C. for 3 hours to obtain a single crystal of chromium. This was confirmed to be a single crystal by the X-ray back reflection Laue method. The influences of the temperature and pressure at sintering against the crystal growth are shown in Table 34. For comparison, though one sintered at 1,000° C. was heat treatment as it was, the recrystallized state was a fine grain.

EXAMPLE 18

Rolled materials obtained by the same procedure as in Example 17 were each cut into the same size and subjected to heat treatment in a hydrogen atmosphere at from 1,200° to 1,600° C. for 3 hours. The relation between the heat treatment temperature and the crystal grain growth is shown in Table 35.

TABLE 34

| Temperature | Pressure | Crystal State |
| --- | --- | --- |
| 1,000° C. | 1,800 atms. | Fine grains |
| 1,200° C. | 1,800 atms. | Giant grains |
| 1,300° C. | 1,800 atms. | Single crystal |
| 1,300° C. | 1,200 atms. | Partly giant grains |
| 1,300° C. | 1,600 atms. | Single crystal |
| 1,300° C. | 2,000 atms. | Single crystal |

TABLE 35

| Heat Treatment Temperature | Crystal State |
| --- | --- |
| 1,200° C. | Fine grains |
| 1,300° C. | Fine grains |
| 1,400° C. | Partly giant grains |
| 1,500° C. | Single crystal grains |
| 1,600° C. | Single crystal |

POSSIBILITY FOR APPLICATION IN INDUSTRY

In accordance to the process of the present invention, giant grains or single crystals of chromium having an arbitrary shape can be produced with good efficiency, and it is possible to produce moldings having a complicated shape from the obtained giant grains or single crystals of chromium. Furthermore, if chromium sintered materials are subjected to plastic processing, it is possible to carry out secondary recrystallization under a relatively mild condition.

What is claimed is:

1. A process for producing giant grains or single crystals of chromium, which comprises heat treating a solid chromium molding to which at least one element selected from the group consisting of Ti, Al, Ca, and Si has been added, or a solid chromium molding which contains Co and to which at least one element selected from the group consisting of Ti, Al, Ca, and Si has been added, each solid chromium molding having a strain imparted thereto by sintering.

2. A process as claimed in claim 1, wherein chromium to which at least one element selected from the group consisting of Ti, Al, Ca, and Si has been added in an amount of from 0.0002 wt % as a lower limit to 0.1 wt % an upper limit, calculated as an oxide thereof, is used.

3. A process as claimed in claim 1, wherein chromium containing from 0.01 to 3 wt % of Co is used.

4. A process for producing giant grains or single crystals of chromium, which comprises heat treating a solid chromium molding which contains at least one member selected from the group consisting of Ti, Ca, Al, and Si as an unavoidable component and into which a strain has been imparted by sintering.

5. A process as claimed in any of claims 1 to 4, wherein a solid chromium molding which has been sintered and subjected to plastic processing is heat treated.

6. A process as claimed in any of claims 1 to 4, wherein a solid molding which has been sintered and molded by a pressing method is heated treated.

7. A giant grain or single crystal of chromium to which at least one element selected from the group consisting of Ti, Al, Ca, and Si has been added in an amount of from 0.0002 wt % as a lower limit to 0.1 wt % as an upper limited, calculated as an oxide thereof, or of chromium which contains from 0.01 to 3 wt % of Co and to which at least one element selected from the group consisting of Ti, Al, Ca, and Si has been added in an amount of from 0.0002 wt % as a lower limit to 0.1 wt % as an upper limited, calculated as an oxide thereof.

8. A process as claimed in claim 2, wherein chromium containing from 0.01 to 3 wt % of Co is used.

9. A process as claimed in claim 8, wherein a solid chromium molding which has been sintered and subjected to plastic processing is heat treated.

10. A process as claimed in claim 8, wherein a solid molding which has been sintered and molded by a pressing method is heat treated.

11. A process as claimed in claim 5, wherein a solid molding which has been sintered and molded by a pressing method is heat treated.

12. The process of claim 1, wherein said heat treating is at 1300° C. but lower than 1860° C. for thirty minutes or more in a reducing atmosphere.

13. The process of claim 4, wherein said heat treating is at 1300° C. but lower than 1860° C. for thirty minutes or more in a reducing atmosphere.

14. The giant grain or single crystal of chromium as claimed in claim 7 obtained by heat treating a solid chromium molding containing at least one element selected from said group of said Co and said at lest one element selected from said group, said solid chromium molding cavity having a strain imparted thereto by sintering.

* * * * *